(12) United States Patent
Corbett

(10) Patent No.: US 7,417,707 B2
(45) Date of Patent: Aug. 26, 2008

(54) INTRODUCTION OF AN INTERMEDIARY REFRACTIVE LAYER FOR IMMERSION LITHOGRAPHY

(76) Inventor: Blaise L. Corbett, 15501 Delaware Dr., King George, VA (US) 22485

( * ) Notice: Subject to any disclaimer, the term of this patent is extended or adjusted under 35 U.S.C. 154(b) by 96 days.

(21) Appl. No.: 11/476,549

(22) Filed: Jun. 29, 2006

(65) Prior Publication Data

US 2007/0127134 A1 Jun. 7, 2007

Related U.S. Application Data

(60) Provisional application No. 60/694,688, filed on Jun. 29, 2005.

(51) Int. Cl.
*G03B 27/52* (2006.01)
*G03B 27/54* (2006.01)

(52) U.S. Cl. .............. 355/30; 355/53; 355/67; 378/34; 378/35

(58) Field of Classification Search .......... 355/30, 355/53, 67, 71, 72, 75; 430/22, 30, 311; 378/34, 35; 250/492.2
See application file for complete search history.

(56) References Cited

U.S. PATENT DOCUMENTS

2006/0033898 A1* 2/2006 Cadee et al. ............... 355/53

2006/0285096 A1* 12/2006 Jacobs et al. ............... 355/53

FOREIGN PATENT DOCUMENTS

WO WO2004112108 * 12/2004

* cited by examiner

*Primary Examiner*—Della J. Rutledge
(74) *Attorney, Agent, or Firm*—McNeely Bodendorf LLP (57) ABSTRACT

An intermediary layer is introduced between a lens and a wafer for an immersion lithography process. A non-supercritical gas is provided and condensed to form a layer of liquid between the lens and the wafer. The substrate may be irradiated through the lens and intermediary layer. In addition, the intermediary layer may then be evaporated. The non-supercritical gas may include superheated steam which may be condensed to form a layer of water between the lens and the wafer. The wafer may be irradiated with one of a EUV light and UV light. A system for introduction of an intermediary layer between a lens and a wafer for an immersion lithography process is also provided. The wafer for use in the immersion lithography process may includes a hydrophobic and hydrophilic surfaces to provide enhanced contact angles between the wafer and the intermediary liquid layer condensed on the wafer and to reduce light aberration provided from a light source through the intermediary liquid layer.

24 Claims, 7 Drawing Sheets

INTRODUCTION OF AN INTERMEDIARY REFRACTIVE LAYER FOR IMMERSION LITHOGRAPHY

PRIORITY

This application claims priority from U.S. Provisional Application No. 60/694,688, filed Jun. 29, 2005, and titled "Introduction of an Intermediary Refractive Layer for Immersion Lithography, which is hereby incorporated by reference in its entirety for all purposes.

TECHNICAL FIELD

The following description relates generally to immersion lithography, and in particular to the process for fabrication of semiconductor materials using immersion lithography.

BACKGROUND

Current techniques for Ultra-Violet Lithography (UVL) are well known and established within the semiconductor fabrication industry. For example, ultra-violet (UV) light having a wavelength of 193 nm is used in the process of photo-etching a semi-conductor microstructure using combinations of positive and negative photo-resists (PR), UV sources, and lensing apparatus. One example of a lens used in this process is a fused silica glass ($SiO_2$); however, technology in lens manufacture is investigating the use of lenses made of other materials, such as calcium fluoride. The continued use of technology employing fused silica lens becomes increasingly difficult due to absorption characteristics of the lens at wavelengths much below 193 nm. For example, the extreme ultraviolet (EUV) systems of 153 nm and less suffer from near total absorption by $SiO_2$ lenses. As a result, there is continued interest in the development of a calcium fluoride lens.

The smallest structure that can be created by a "dry" lithography UV system is about 100 nm and is referred to as the resolution of the system. The resolution of a lithography system is limited by the nature of light passing from one medium to another, the resolving power of the lens used, and Rayleigh's Criterion. Rayleigh's Criterion is a function of the wavelength of a light source, the refractive index "n" of a lens, the physical diameter of the lens, and the angle separating the maximum and minimum points of diffraction of the light source through the lens.

One way of increasing the resolving power of a lens is to increase the diameter of the lens while maintaining a constant focal length, which in turn increases the numerical aperture of the lens (a term commonly used in photography to express capturing the detail of a subject by increasing the amount of light incident on a lens). However, according to Snell's Law of Reflection, the angle that a light ray can intercept the boundary layer between two refractory mediums before there is total reflection of the light ray within the medium with a higher refractive index is limited. Therefore, the practical size of lens that may be used in the dry process is restricted.

Because of the technical difficulties encountered developing EUV systems, "Immersion Lithography" is being investigated as an alternative to conventional dry lithography processes. Immersion Lithography is a "wet" process that uses water as an intermediary refractive layer between the lens and the wafer substrate being exposed to an UV light source. One advantage of IL is that water has a higher refractive index (e.g., about 1.4 at 29° C.) than air (e.g., about 1.0). The index of refraction of pure water is significantly closer to the index of refraction for a silica lens than air. Therefore, bending is reduced, a larger lens may be used, and the numerical aperture and the resolving power of the system are increased. As a result, the resolving power of the lens/water system is substantially greater than the lens/air system The refractory properties of water in all of its physical states have been thoroughly investigated. The index of refraction of water is based on the physical system under which it exists and the wavelengths of light to which it is being exposed. The refractive index for water can be determined a number of ways, although direct observation for a fixed set of conditions is the most reliable. Good approximate values can be calculated for a wide spectrum of wavelengths using a derived formula first presented in a paper by P. Schiebener et al. and later modified by Levelt Sengers et al. The formula is as follows:

$$(n^2-1)/(n^2+2)*(1/\rho) = a_o + a_1\rho + a_2T + a_3\lambda^2 T + a_4/\lambda^2 a_5/(\lambda^2-\lambda^2_{uv}) + a_6/(\lambda^2-\lambda^2_{IR}) + a_7\rho^2$$

$a_0$=0.244257733  $a_4$=1.58920570×10−3  $\lambda_{UV}$=0.229202
$a_1$=9.74634476×10−3  $a_5$=2.45934259×10−3
$\lambda_{IR}$=5.432937
$a_2$=−3.73234996×10−3  $a_6$=0.900704920 T=normalized (K)
$a_3$=2.68678472×10−4  $a_7$=−1.66626219×10−2
$\lambda$=normalized
ref-$\rho$*=1000 kg m−3 ref-T*=273.15° K. $\rho$=normalized
ref-$\rho$*=0.589 um Values close to points of discontinuity may be approximated through extrapolation and checked through observation. The above formula uses reference values to derive dimensionless constants in order to take into account the variables of density, temperature, and wavelength. The formula itself was numerically derived using observed values and a curve-fitting algorithm. Extrapolated results have been demonstrated to give good approximate values. Other formulas to derive the refractive index of water using observed dielectric values may be found.

Two processes being investigated using water as an intermediary layer are briefly described in an IEEE article, "*Chip Makings Wet New World*" by Linda Geppart, Spectrum-IEEE Press, May 2004 and are briefly described here. One method uses total immersion lithography in which the lensing system and wafers are completely immersed in water during the lithography process. However, full immersion of the system provides slower processing times due to the inertial forces of the water. For example, the inertial forces affect the velocity of moving the wafer, fluctuations in optical properties due to currents in the water and temperature gradients, and the inability to properly control the creation of air bubbles either through cavitations of the moving mechanisms or air bubbles trapped on the wafer's photo-resist during immersion (which affect the number of defects created on the substrate during processing). In addition, particle and chemical contaminants are introduced in the liquid medium with one possible particle source being the photo-resist layer itself.

A second method being developed uses a water injection system whereby a layer of water is injected via nozzles located around the lens onto a wafer substrate. After the wafer has been exposed to the UV light source, the water is "sucked up" by the injector system. However, the water injection system also produces air bubbles within the water layer that are introduced by the injectors in addition to air bubbles trapped on the photo-resist as the water is sprayed over the surface and contaminants are introduced within the medium due to the injection of water directly onto the photo-resist resulting in photo-resist surface ablation.

SUMMARY

In one general aspect, a method for introduction of an intermediary layer between a lens and a wafer for an immersion lithography process is provided. The method includes providing a non-supercritical gas; condensing the gas to form a layer of liquid between the lens and the wafer; and irradiating the substrate through the lens and intermediary layer. In addition, the intermediary layer may then be evaporated. The non-supercritical gas may include superheated steam which may be condensed to form a layer of water between the lens and the wafer.

The method may further include positioning the lens relative to the substrate to form a single intermediary layer of liquid between the lens and the wafer from the layer of liquid on the lens and the layer of liquid on the wafer.

The gas may be condensed as a layer of liquid on the lens and as a layer of liquid on the wafer. The gas may be condensed by cooling at least a portion of the substrate to condense the gas as a layer of liquid on the wafer. The lens may be cooled to condense the gas as a layer of liquid on the lens.

The lens and its liquid layer may be moved into contact with the liquid layer of the substrate to form a single intermediary layer of liquid between the lens and wafer. In addition, the substrate and its liquid layer may be moved into contact with the liquid layer of the lens to form a single intermediary layer of liquid between the lens and wafer. The lens and its liquid layer and the substrate and its liquid layer may both be moved into contact to form a single intermediary layer of liquid between the lens and wafer.

The substrate may be irradiated with one of a EUV light and UV light.

The gas may be condensed to form a liquid layer in one or more zones on the wafer. To do this the wafer may be cooled by cooling one more zones of a wafer table corresponding to the one more zones on the wafer.

The gas also may be condensed to form a liquid layer on a photo resist of the wafer.

In another general aspect, a system for introduction of an intermediary layer between a lens and a wafer for an immersion lithography process comprises: a chamber; a source to irradiate the wafer with electromagnetic waves; a lens assembly including the lens adapted to allow the electromagnetic waves to pass through the lens to the wafer; a non-supercritical gas source; a device to hold the wafer including at least one thermoelectric device to cool at least a portion of the wafer to condense the gas as a liquid layer on the wafer.

The source may be one of a UV and a EUV source.

The holding device moves the wafer in a plane orthogonal to an axis of the lens assembly to position the wafer and the lens assembly moves along the axis. In addition, the holding device may includes a plurality of the thermoelectric devices arranged to cool multiple zones on the wafer to condense the gas as a liquid layer in the zones.

The lens assembly may include a cooling device to cool the lens to condense the gas to form a liquid layer on the lens.

The wafer may include a surface having hydrophobic characteristics to provide enhanced contact angles between the condensed liquid layer and the wafer surface. The wafer also may includes a surface having an area with hydrophobic surface characteristics and an area having hydrophilic surface characteristics to provide enhanced contact angles between the condensed liquid layer and the wafer surface to reduce light aberration provided from the source through the condensed liquid layer.

In another general aspect, a wafer for use in an immersion lithography process includes a first surface and a second surface, the first surface including area having hydrophobic characteristics to provide enhanced contact angles between the first surface and a liquid layer condensed on the first surface. In addition, the wafer may include another area having hydrophilic surface characteristics to enhance formation of the intermediary liquid layer and to reduce light aberration provided from a light source through the intermediary liquid layer.

Other features will be apparent from the description, the drawings, and the claims.

DESCRIPTION OF DRAWINGS

Like reference symbols in the various drawings indicate like elements.

DETAILED DESCRIPTION

The following describes introducing of an intermediary layer between a lens and a substrate (with photo resist) for a lithography process that may be used in the manufacture and processing of semiconductor devices, such as wafers. In one general implementation, a sub-critical or non-supercritical gas is condensed to form a layer of liquid between the lens of lithography device and the semiconductor wafer, which may include a photo resist. The wafer may be irradiated by a light emitting apparatus though the lens and intermediary layer. The liquid is then evaporated from the wafer. The process, apparatus, and other details are described in further detail below. Although the following description provides a number of examples in which steam is condensed to water to create the intermediary layer, other non-supercritical gasses may be condensed to their liquid state to form the intermediary layer, such as liquid nitrogen so long as the relative refractive index of the liquid medium is sufficiently close in value to the refractive index of the crystal lens material.

Figure 1:
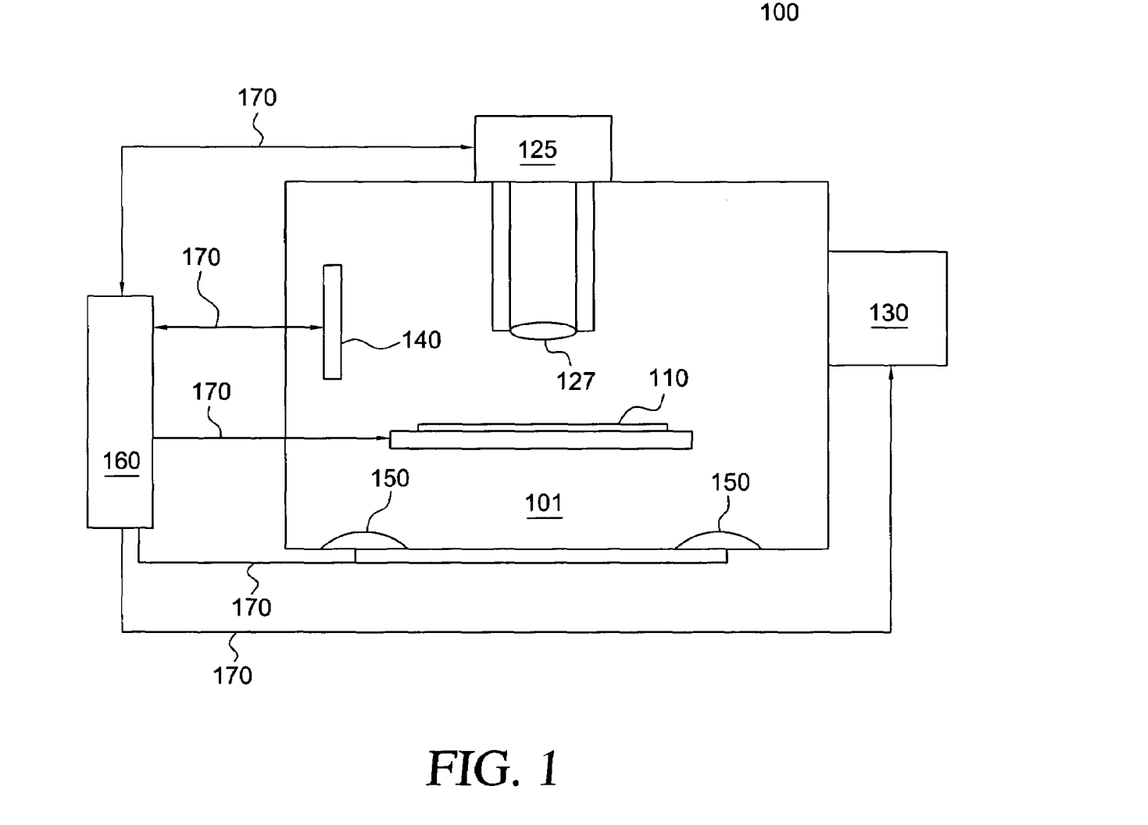
FIG. 1 is an exemplary system for introduction of an intermediary layer for photolithography.

As shown in one exemplary embodiment of FIG. 1, the system 100 employs a pressure-sealed processing chamber 101 into which a semiconductor wafer or substrate 110 is placed on a wafer holding device 120. The wafer may include any number or combinations of layers that are to be processed by a photolithographic process. The wafer may include one or more positive or negative photo resists. A light emitting device 125 for photolithography, such as a laser, a DUV or an EUV emitting device is positioned to irradiate the wafer and photo resist through a lens 127. An apparatus, device, or assembly 130 is used to introduce a non-supercritical gas into the chamber, such as, for example, steam. Sensors 140 may be placed in the chamber to monitor and/or regulate temperature and pressure within the chamber 101. Heating elements and pressure regulators 150 may be used to maintain, regulate, and control chamber conditions during the processing of the wafer. One or more controllers 160 may be provided to control various system processes and devices, such as the sensors/regulators, positioning device, light emitting apparatus/lens assembly, and gas/pressure assembly using communications paths 170.

Figure 2:
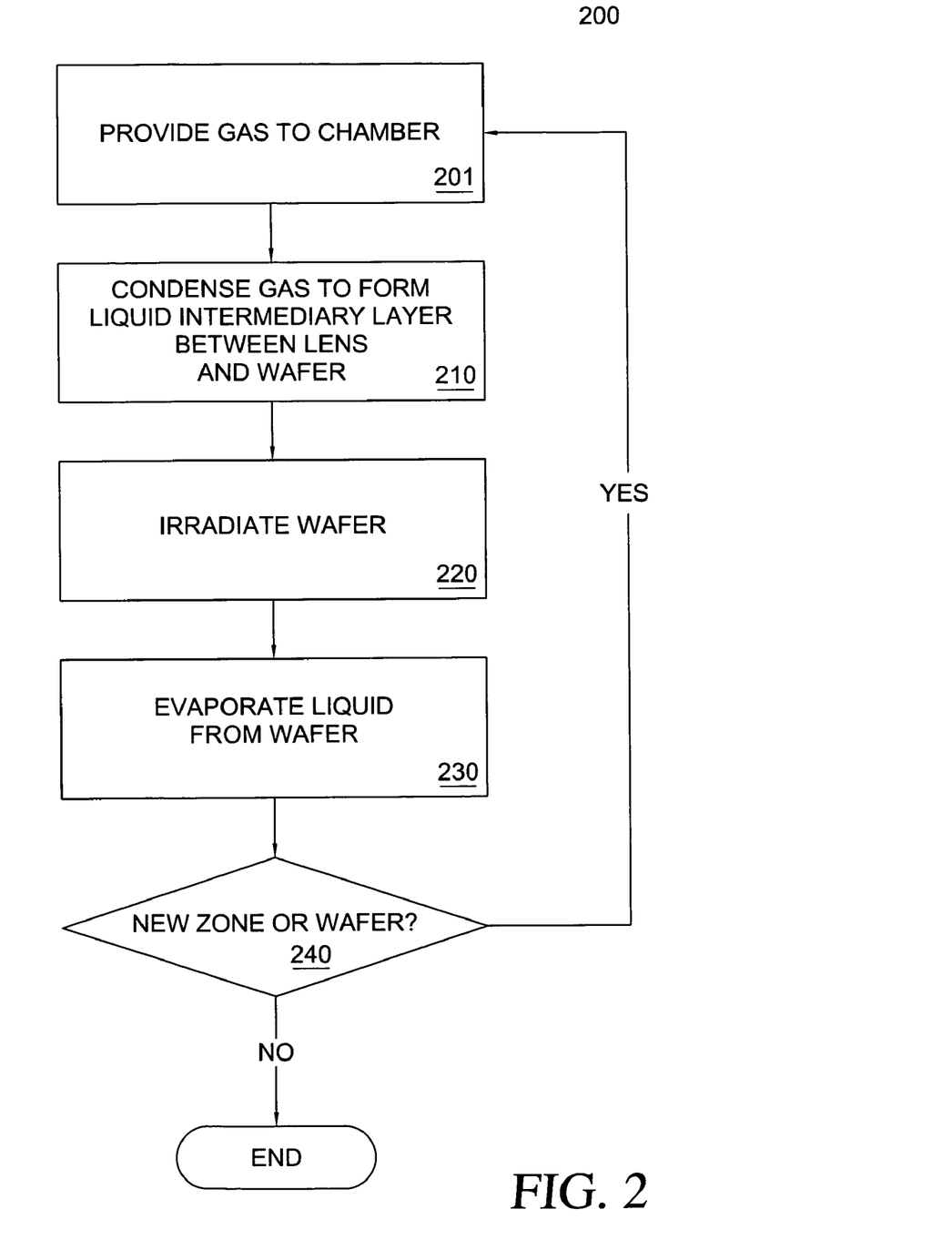
FIG. 2 is an exemplary process for use in the system of FIG. 1.

As shown in FIG. 2, according to one implementation, a process 200 may be used to implement Immersion Lithography. According to the process 200, a non-supercritical gas is provided in a semiconductor processing chamber 201. The gas is condensed to form a intermediary liquid layer between a lens of a photo lithography assembly and a wafer 210. As described above, the wafer may include a photo resist as used in photolithographic processes. The lens may be positioned relative to the wafer such that a single, intermediary layer of liquid is formed between the lens and the wafer. For example, a layer of liquid may be condensed on the lens and the wafer and the lens and/or wafer may be carefully positioned such that the layers contact to form a single layer (as described in greater detail below). In another example, the lens and wafer may be positioned before the gas is condensed such the gas condenses on the lens and/or wafer until a suitable thickness is achieved, to form a single intermediary layer between the lens and the wafer. The wafer is then irradiated using the lens assembly according to a lithography process 220. The liquid intermediary layer is then evaporated from the wafer 230. This process may be repeated as desired to irradiate different portions or zones of the wafer, as described in greater detail below. In addition, zone cooling of the wafer may be use to control where the intermediary layer is formed on the wafer. In addition, a number of zones may be activated simultaneously to increase the time efficiency of the process. By controlling cooling of a selected portion or zone of the wafer, chamber pressure, and temperature within the sealed chamber, the intermediary layer may be formed on the wafer at any desired location and thickness. By limiting the area of the cooling zone, temperature of the zone may be read via a laser tracking infrared detector within 1 degree Celsius. Laser refraction/reflection may be employed to determine whether or not the thickness of the intermediary layer is within specifications for the process exposure of whether a desired thickness has been formed. A reduction of pressure within the chamber and the increase in temperature over the exposed zone results in the evaporation of the intermediary liquid layer back to a vapor state.

Figure 3:
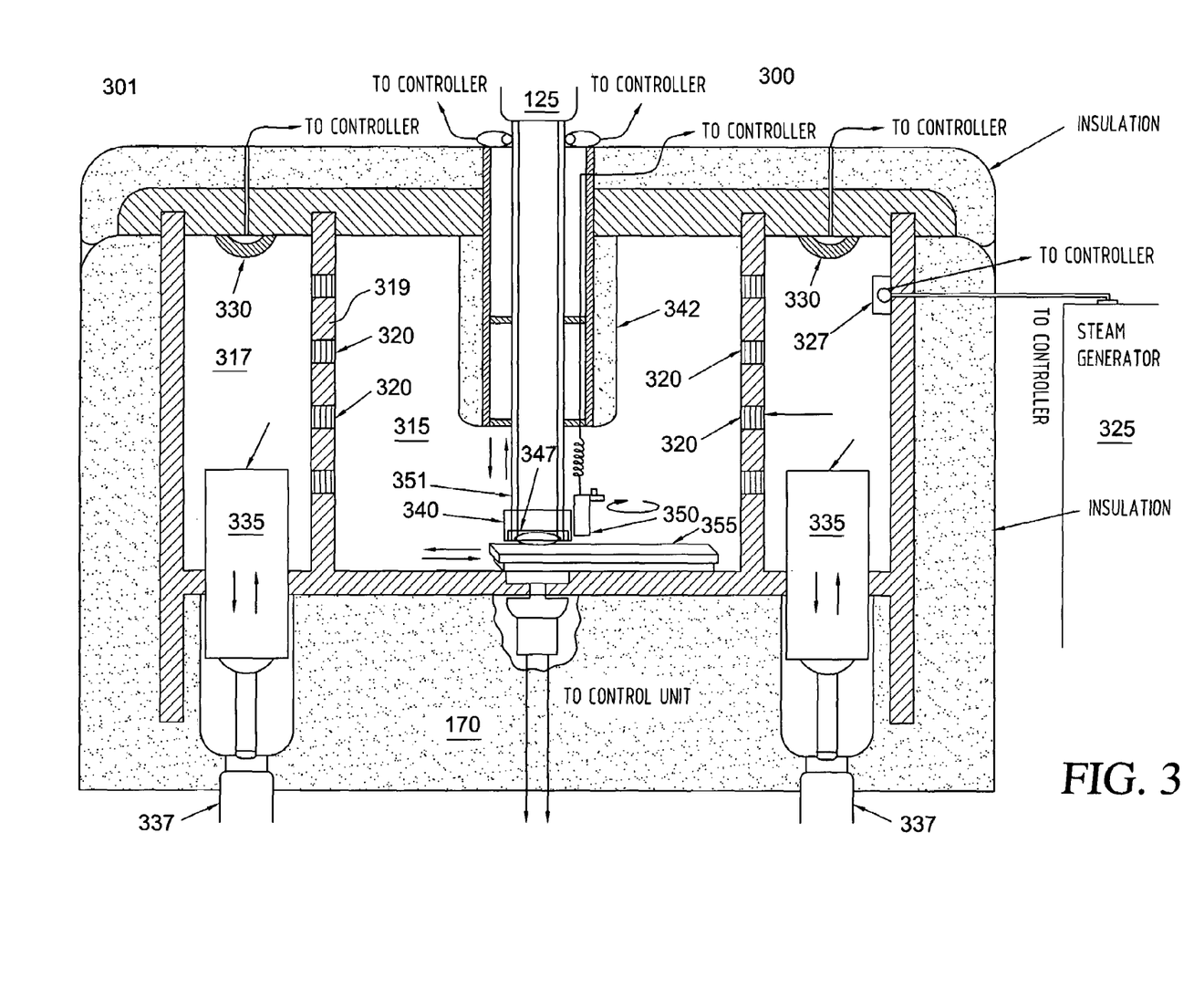
FIG. 3 is one exemplary processing chamber for use with the process of FIG. 2.

FIG. 3 shows one implementation of a wet lithographic system 300 for implementing the process 200 of FIG. 2. The process 200 is carried out using a process chamber 301. Insulation 310 may be provided around the exterior of the chamber 301 to facilitate temperature and pressure control within the chamber 301. In one implementation, the chamber 301 may be nested to include an inner chamber 315 and an optional outer chamber 317. The outer chamber 317 may be provided to facilitate regulation of the system pressure and/or temperature of the inner chamber 315 during the lithography processes described herein. The chambers 315, 317 may be separated by a wall 319 that is ported and/or include openings 320 that allow gas to travel between the chambers 315, 317.

A boiler 325 or other device may be used to generate or provide a non-supercritical gas or vapor (e.g., steam) at a desired temperature and pressure to the chamber 301. In one implementation, the gas is steam and the intermediary liquid layer formed is water. The gas is introduced in the outer chamber 317 from the boiler 325 via a steam inlet valve 327. The outer chamber also may be provided with heating elements 330 to control, regulate, and/or maintain temperature within the chamber 301. Once introduced in the outer chamber 317, the gas (e.g., superheated steam) may be forced from the outer chamber 317 to the inner chamber 315 through the ported wall 319 using, for example, one or more pistons 335 controlled by either a single or a plurality of actuators 327. The pistons 335 may enter the outer chamber 317 to force or displace the gas through the ports 320 of the ported wall 319. The nested configuration 300, shown in FIG. 3, including inner and outer chambers may be used to decrease the effect of the heating elements 330 and particle motion of the gas within the inner chamber 315.

A lens housing 340 and assembly 342 for use in conjunction with the photolithography apparatus 125 is located within the inner chamber 315. The assembly includes a lens 127, an attached lens collar 347, the comprehensive measurement unit 350, and housing tube 351 are located above a wafer positioning device 355, such as, a translatable wafer table.

The heating elements 330, actuators 327, comprehensive measurement unit 350, and wafer table 355 may be controlled by a control unit that is operated by a user and/or automated processing software. The control unit 160 may be implemented using a processing device, such as a general-purpose or a special purpose computer, for example, a processor, a digital signal processor (DSP), a microcomputer, or a microprocessor capable of responding to and executing instructions in a defined manner. The processing device may run one or more software applications including drivers for the various system components (e.g., the heating elements, the actuators, the comprehensive measurement unit, and the wafer table) and a user interface, such as a user interface for controlling system processes, for example, a lithography process. The software applications may include a computer program, a piece of code, an instruction, or some combination thereof, for independently or collectively instructing the processing device to operate as desired. The processing device also may access, store, manipulate, and create data which may be accessed from or stored in a storage device in response to the applications.

The applications and data may be embodied permanently or temporarily in any type of machine, component, physical or virtual equipment, storage medium, or propagated signal wave capable of providing instructions to or being interpreted by the processing device. In particular, the applications or data may be stored by a storage device or medium, such as a memory including, for example, volatile and non-volatile memories (e.g., a read only memory (ROM), a random access memory (RAM), a flash memory, a floppy disk, a hard disk, a compact disk, a tape, a DROM, a flip-flop, a register, an SRAM, DRAM, PROM, EPROM, OPTROM, EEPROM, NOVRAM, or RAMBUS), such that if the memory is read or accessed by the CTS processing device the data is stored/accessed and/or the specified steps, processes, and/or instructions are performed. The memory device also may include lookup tables or database for use by the processing device to control system devices, drivers, and processes.

The control unit 160 may include any number of other devices, components, and/or peripherals, such as additional computing devices, memory/storage devices, input devices, audio devices, microphone, output devices, display devices, interfaces. The control unit 160 may communicate with the various system components using communications paths 170 that may be configured to send and receive signals (e.g., electrical, electromagnetic, or optical) that convey or carry signal or data streams representing various types of analog and/or digital data or commands. For example, the communications paths may be implemented using various communications media and one or more networks comprising one or more network devices. In addition, the communications paths 170 may include one or more wireless links that transmit and receive electromagnetic signals, such as, for example, radio, infrared, and microwave signals, to convey information.

Figure 4:
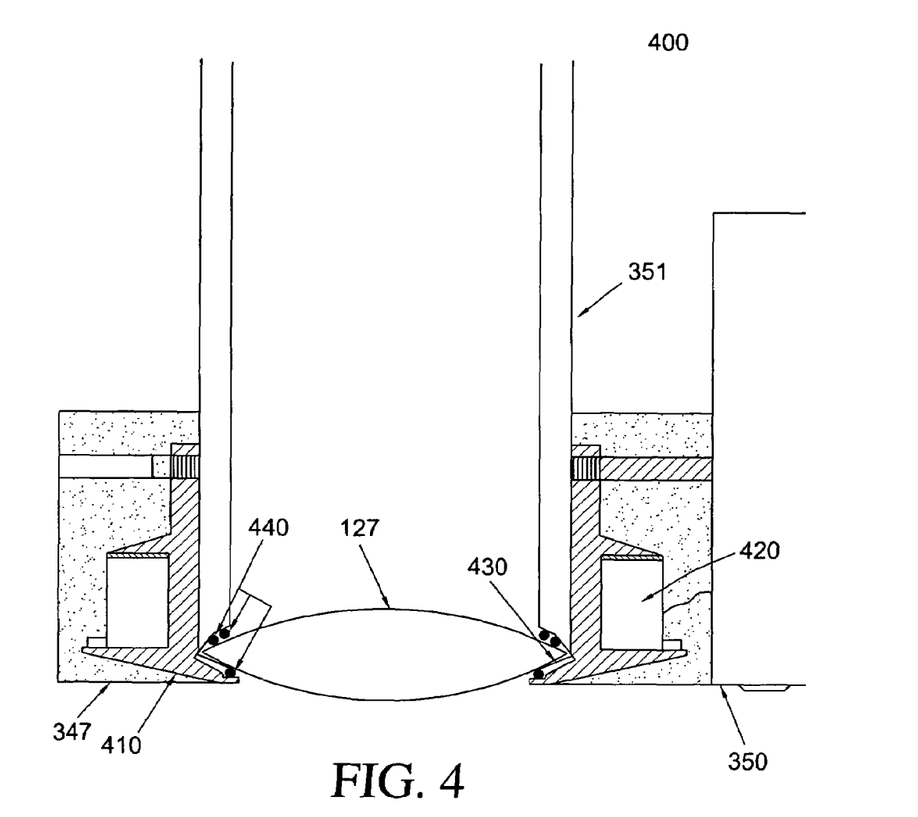
FIG. 4 is a side cutaway view of the lens collar assembly.
Figure 5:
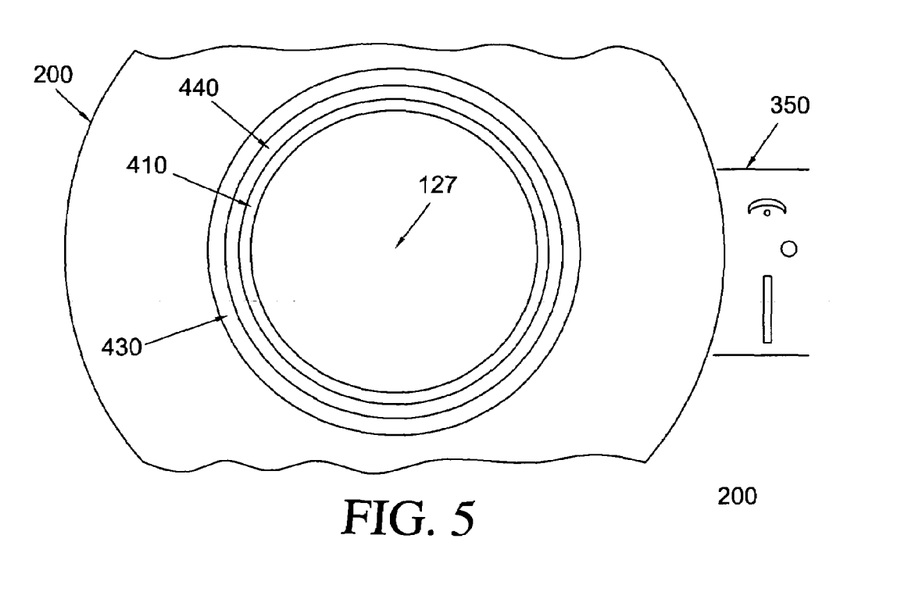
FIG. 5 is a bottom view of the len collar assembly of FIG. 4.

FIG. 4 shows a cutaway side view 400 and FIG. 5 shows a bottom view 500 of one example of the lower lens housing 340. In one implementation, the housing may be positioned along an axis perpendicular to the plane of the wafer table 355, and the wafer table 355 may be moved in any direction within the plane to position the wafer relative to the lens 127 and apparatus 125. Of course, one will appreciate that the lens housing and wafer table 355 may be moved and/or positioned in other ways. For example, the wafer table 355 also may be positioned along the axis and the lens housing 350 may be moved in plane parallel to the plane of the wafer table 355.

As shown in FIG. 4, the lens 127 is seated at the base of the lens housing tube 351 by a lens collar 347. The collar 347 holds lens 127 in place, for example, by threading onto the lower housing tube 351 using a collar frame 410. The collar frame 410 also provides a rigid platform for thermoelectric devices 420. The thermoelectric devices 420 make thermal contact with the lens 127 through thin metal contact 430 and may be controlled by the control unit 160. The inner lens housing may be sealed against moisture and pressure through one or more ring seals 440. The thermoelectric devices 420 may be insulated from the environment of the inner chamber 315 by an insulated collar covering 450.

A comprehensive measurement unit 350 may be positioned adjacent to or as an extension of the side of the collar 347. The comprehensive measurement unit 350 may include instrumentation used for environmental measurements, wafer zone temperature measurements, and liquid water thickness measurements. The measurement unit 350 may include, for example, a laser targeted Infrared (IR) temperature detector and a laser source and detector combination to determine the thickness of the intermediary layer introduced between the lens and the wafer. The detector may be used to calibrate the lens assembly by storing typical process operation values to allow for faster fabrication times. Once calibrated, the lithography process may proceed and the laser detector may be used for other purposes, such as, for example, a procedural check for the thickness of the intermediary layer. The measurement unit 350 also may monitor the inner chamber environmental conditions, such as, for example, chamber pressure, moisture content of the vapor, and temperature. Data for these measurements may be relayed via a communications path 170 to the control unit 160.

Figure 6:
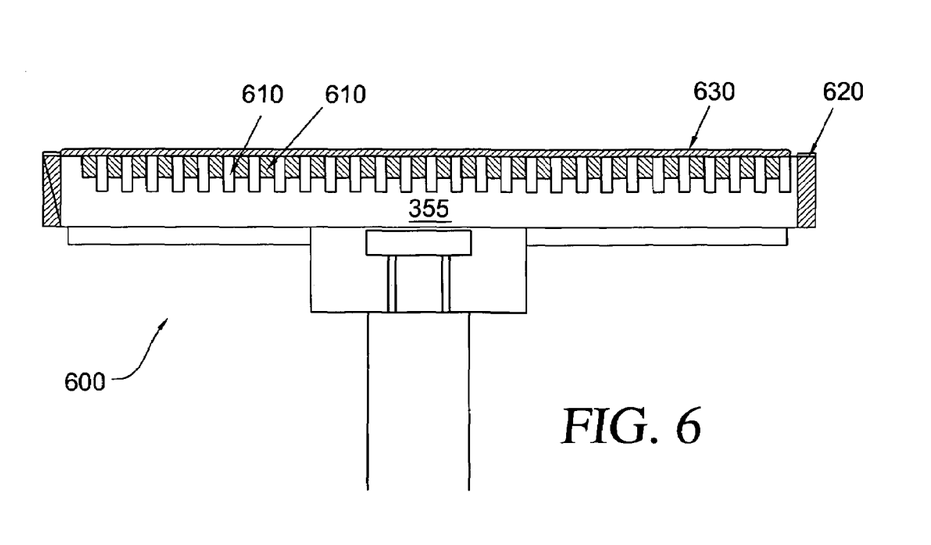
FIG. 6 is top view of a lens processing table for use in the chamber of FIG. 3.
Figure 7:
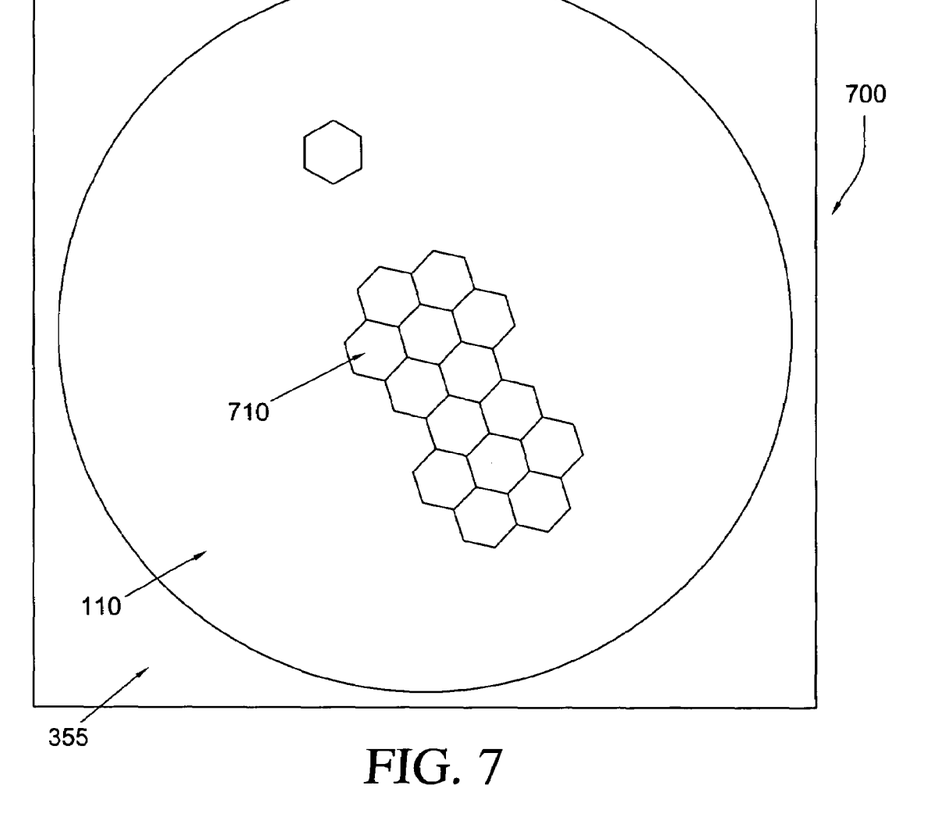
FIG. 7 is a cutaway side view of the processing table of FIG. 6.

FIG. 6 shows a cutaway side view 600 and FIG. 7 shows a top view 700 of the translatable wafer table 355. In one implementation, the table 355 includes a plurality of thermoelectric device contact devices 610 which may be arranged, for example, in a hexagonal honeycomb pattern 710 at the surface of the table on which a wafer is positioned for photolithographic processing. The perimeter 620 of the table may be defined by a very thin insulation surface 630, such as, for example, glass. In one implementation, the thermoelectric devices 610 may be implemented using paired p and n devices, such as, for example, peltier devices, provided to heat and cool a selected zone of the wafer with one or more paired devices per zone. Each thermoelectric device 610 is controlled by the control unit 160.

Figure 8:
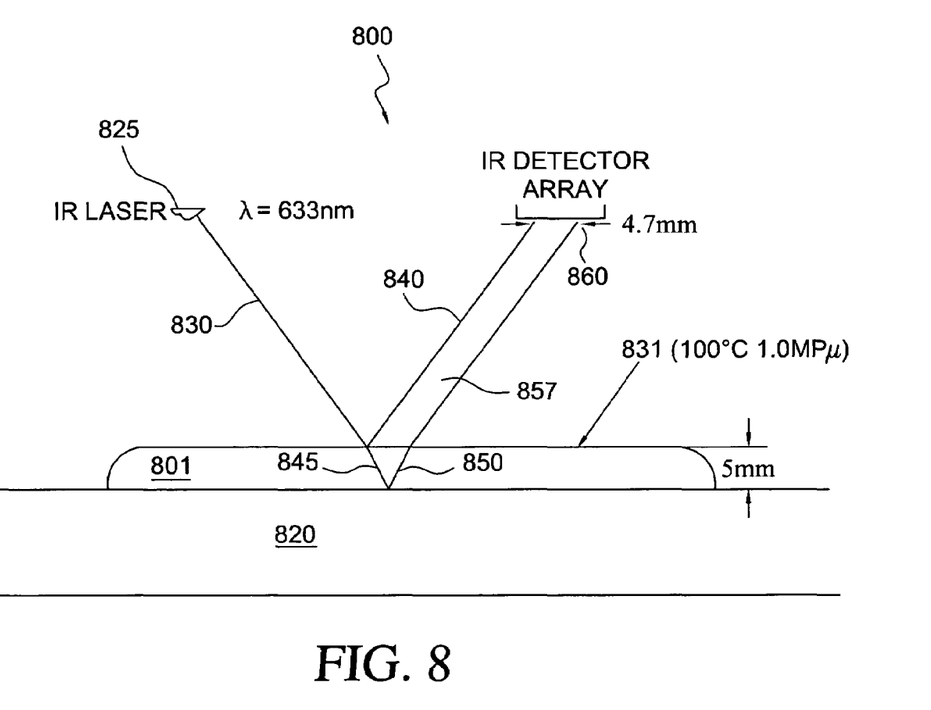
FIG. 8 is an exemplary intermdiary layer thickness detection assembly.

During microelectronics processing, laser ellipsometry may be used to determine the characteristic thickness of an intermediary layer to a few microns, although other procedures also may be used such as, for example, capacitive and ohmic probes. For example, a laser/detector arrangement also uses the reflective and refractive properties of a liquid layer (e.g., water). FIG. 8 shows one such exemplary implementation 800 using the comprehensive measurement unit 350 to project an IR laser beam onto an area of conjoined first and second layers. In the example shown in FIG. 8, the first layer 801 is water and the second, reflecting layer 820 is semiconductor substrate material coated with a photo resist. The refractive index for the intermediary layer, in this case water, at a given temperature may be determined by the control unit 160 using a look-up table of the memory device. The IR laser 825 of the measurement unit 350 directs a laser beam 830 at the layers at an angle. The beam 830 partially reflects and partially refracts at the surface 831 of the first layer 801 forming a first reflected beam 840 and a first refracted beam 845. The first reflected beam 840 reflects from at an angle of incidence to the surface 831. The first refracted beam 845 enters the first layer 801 at an angle and bends according to Snell's Law. The first refracted beam 845 is reflected as a second reflected beam 850 at the surface 855 of the wafer. Although there may be a small amount of refraction at this layer as well, the energy involved is very small. The second reflected beam 850 emerges from the intermediary layer 801 to form a second refracted beam 857 that bends away from vertical at a predetermined amount according to Snell's Law. The first reflected beam 840 and the second refracted beam 857 are received by an IR detection circuit 859 of the measurement device 350. The two beams 840, 857 are separated by a predetermined distance as they encounter the laser detection circuit 859. The measurement unit 850 measures the distance 860 separating the detected beams and provides the distance 860 to the control unit0 160. The control unit 160 uses the distance to accurately determine the depth of the first layer 801 to fractions of a millimeter. For example, the processing device of the control unit 160 may use a look-up table with stored values that correspond to the determined distance at a certain pressure and temperature for a specific liquid of the intermediary layer. In addition, the values may be adjusted based on data collected and stored in memory during the previous process calibration.

As described above, positive and negative photo resist are used in lithographic processing. Most photo resists are water resistant once baked; however, different formulations of photo resist result in different temperature performance characteristics. These characteristics involve the behavior of the resist on the wafer as the temperature changes from ambient conditions. There are any number of common formulations may be used at temperatures of approximately 90° C. to 100° C. However, exceeding the range may result in the deformation or de-lamination of certain photo resists due to differences in the expansion rates between the substrate wafer and the photo resist. These characteristics become more obvious if the photo resist layer is particularly thick, and, as a result, common formulations for photo resists may not be appropriate, when used at high temperatures above this range. Instead, high temperature photo resists developed, for example, by IBM Corp., Shipley Corp., and ARCH Chemicals Inc. may be used, such as, for example, UV2HS, a Deep Ultra-Violet (DUV) photo resist capable maintaining chemical stability at temperatures of 150° C. In one implementation, the photo resist used should be able to handle temperatures of 130° C. or better; however, depending on the choice made among the high temperature photo resists available, analysis may be used to determine the elastic stressing limits of the individual photo resists in relation to the wafer or substrate when subjected to temperature gradients between neighboring zones on the wafer.

The surface characteristics of the photo resist layer also are taken into consideration. Surface characteristics, such as, for example, the roughness of the surface, impact the thickness of the liquid layer or intermediary layer formed within a zone on the surface of the wafer. There also exist other characteristics due to the chemical constituency of the photo resist that may be considered, such as the chemical adhesion processes between a liquid (e.g., water) and the photo resist. A number of common surface materials are described below to demonstrate how surface characteristics affect the thickness of the layer of water. Some examples include:

| Surface Material | Water Thickness (mm) |
| --- | --- |
| Common glass | less than 1.0 |
| Polished steel | 3.5 |
| Polyethylene | 4.0 |
| Silver duct tape | 4.0 |
| Masking tape | 4.5 |
| PTFE (Teflon) | 4.5 |
| Non-glossy paper | 5.0 |
| Fine grit sandpaper | greater than 5.0 |

In one example, rougher substances form thicker liquid layers. For example, PTFE from the above list demonstrates one example of a layer having suitable qualities due to the microstructure roughness and lower chemical adhesion properties mentioned. Rougher surface characteristics of a baked photo resist may be used to enhance liquid layer thickness. Generally, a rougher surface results in a higher surface contact angle or the angle formed between a surface and a liquid. This angle is defined as the angle of tangency of the liquid at the initial point of contact with a surface. A liquid lying very flat on a surface has a surface contact angle much less than 90° with minimal relative height whereas a liquid lying on the surface like a ball has a surface contact angle of 180° with maximum relative height. A surface demonstrating a relatively high contact angle is defined as hydrophobic whereas a surface demonstrating a relatively low contact angle is defined as hydrophilic. If the photo resist itself does not show significant hydrophobic characteristics, a secondary process may be used to deposit a thin layer of dielectric material to produce the desired surface characteristics. In another example, the surface may be processed to produce a rougher surface having the desired qualities. The photo resist material should have optical characteristics that prevent significant spectral absorption and may be designed to be relatively neutral to the photo resist to which it is applied to avoid contamination that may be detrimental to the structure formations.

Desirable surface characteristics may be obtained by applying optical coatings composed of metal oxides. For example, a number of low temperature processes exist that have good surface adhesion to polymers and are also chemically neutral relative to polymers and common substrate materials, such as silicon and germanium.

The surfacing material should be suitably thin to limit the absorption of the UV light by the surface material and minimize surface reflection. Percentage of transmission may be used to determine the suitability of the surface layers. In one example, to determine suitability the formula for incident energy transmission is $<I_t=I_o e^{-\alpha l}>$ is used, where $<I_o>$ is the incident intensity, $<I_t>$ is the transmitted intensity, $<\alpha>$ is the absorption coefficient and $<l>$ is the material thickness. Using published data for UV applications and extrapolating, approximate values for absorption coefficients in the higher UV ranges for different materials may be determined. The maximum thickness of the surface layer to reduce reflection may be calculated by applying the quarter wavelength rule for anti-reflective surfaces. The formula is given as $d=\lambda/4n$ where d is the material thickness of the material, $\lambda$ is the wavelength of the incident light, and n is the refractive index of the material. The percentage of light energy that is transmitted through the material may be calculated to determine the suitability of the material. The values given here are approximate. Actual values are dependent on both wavelength and microstructure. Microstructure is in turn dependent on the selected process. Therefore, depending on the process, the values are determined for exact measurement. It should be pointed out that surface characteristics of the photo resist also may be modified by the zone cooling process itself and advantageously exploited to eliminate the need for an added surface layer and process.

One such investigation for the application of metal oxides was performed and published by the group of Angela Duparré et al. Their investigation involved the application of $ZrO_2$ to a surface substrate using electron beam evaporation. Using this technique the team successfully developed an optically good, thin surface with the appropriate characteristics of a hydrophobic surface with significant surface contact angles. The technique was developed using the idea of a self-cleaning lens. This process currently has a patent pending. Another group, Z. W. Zhao et al, investigated a low-temperature method in which $ZrO_2$ was deposited by method of cathodic vacuum arc-deposition. The process employed rather modest low pressures of $4\times10^{-6}$ Torr, various oxygen flow rates and substrate temperatures that did not exceed 100° C. Deposition rates of 35 to 75 nm/min allow for good control of the layer thickness. Although $ZrO_2$ has a rather high absorption coefficient at the required wavelength (and therefore may not be particularly suited to this process) the techniques outlined for the depositions in the papers may be applied to other materials.

Another material that may be used is Tin Oxide (SnO2),(a heat tolerant optical coating with low spectral reflection and absorption). Additionally, Sn (tin) as an elemental material has extremely low material absorption characteristics for both germanium and silicon substrates at the low temperatures being recommended. In a paper by K. S. Shamala et al., $SnO_2$ is deposited on a silicon substrate using electron beam evaporation. Substrate temperatures are varied between 150° C. and 370° C. during the deposition process. The material has a refractive index of ~2.2 at 200 nm. Again using the ¼ wave rule for reflective surfaces and the transmission equation with extrapolated $<\alpha>$, a layer thickness of less than 22 nm could, for example, provide $\geq 40\%$ transmission at the 193 nm wavelength.

Figure 9:
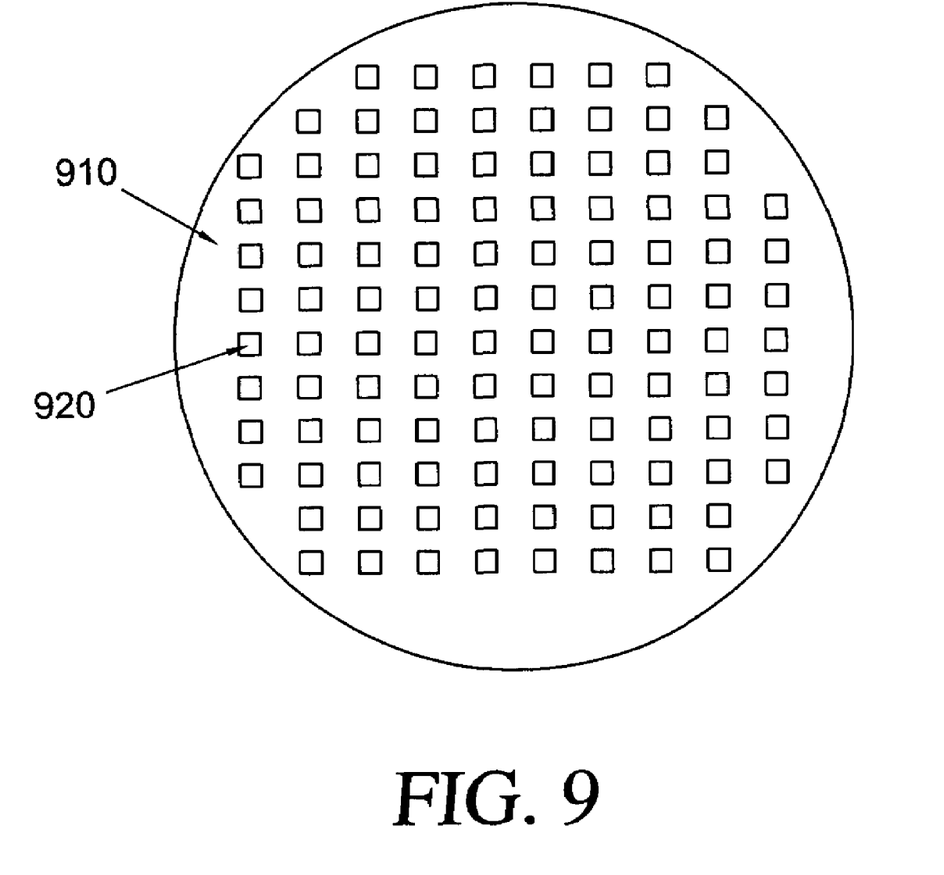
FIG. 9 is an exemplary illustration of a wafer with hydrophillic regions bounded by a hydrophobic surface.

An alternative process combines the use of hydrophobic and hydrophilic surfaces on a single wafer FIG. 9. As shown in FIG. 9, a wafer with photoresist applied may have an overall hydrophobic surface 910 with separately applied regions having hydrophilic properties 920. Using this arrangement, the liquid medium formed during the condensation process has a significantly reduced contact angle with the wafer. By definition, the liquid more closely adheres to the photoresist region with the hydrophilic properties. The surrounding hydrophobic region effectively bounds the intermediary liquid layer maintaining relatively high contact angles between the liquid layer and the wafer. The end result is reduced focal aberration by the intermediary liquid layer at the surface of the wafer resulting in better resolution for creating devices on the wafer material.

A hydrophilic material is to be considered for this process is Titanium Oxide ($TiO_2$). This material may have much better optical characteristics in the sub-200 nm wavelengths range. A low-temperature process outlined in a paper by J. T. Rantala et al. uses an aqueous sol-gel spin-on deposition. The process demonstrates a technique whereby sol-gel chemical precursors are neutralized to prevent polymer contamination. The process may be carried out with curing temperatures ranging from 150° C. to 350° C. The lower temperature process results in a rougher surface characteristic. The resulting refractive index is extrapolated to ~2.0. The resulting layers have excellent adhesion to polymeric surfaces and silicon. Applying the ¼ wave rule for reflective surfaces and the transmission equation with extrapolated <α>, thin layers of less than 24 nm could provide ≧50% transmission at the 193 nm wavelengths. The process outlined also provides a comparably low cost of the equipment and incidentals for the process. This translates into minimal extra investment by the manufacturer.

Pure $TiO_2$ is hydrophilic in nature but could experience gassing when exposed to strong UV light. As a result, the application of different hydrophilic/hydrophobic materials may have to be introduced in a modified process.

As a final consideration to this added process, the surface contact angles produced by hydrophobic surface layers should not significantly exceed 120°. Exceeding this angle may lead to excessive inertial stability of the intermediary layer on the wafer surface, resulting in, for example, droplet roll-off during periods of table translation. If desired, the wafer with photo resist that has been pre-exposure baked, may have a thin layer of material, such as, for example, $SnO_2$ and/or $TiO_2$ deposited on the wafer surface as a layer on top of the photo resist to enhance the surface characteristics of the photo resist. This enhancement is commonly referred to as a hydrophobic and/or hydrophilic surface, respectively. A number of processes were briefly discussed above that may be used to provide this surface.

The wafer with photo-resist is placed within the nested chamber 301 and the chamber is sealed. At this stage, ambient pressure within the chamber 301 is approximately 0.1 MPa (or 1.0 normal atmospheres). The heating elements 330 are turned on and set at a desired temperature, for example, slightly greater than 140 degrees Celsius by the control unit 160. The pistons 335 are placed in a waiting position slightly higher than their lowest translatable position proving maximum volume within the outer chamber 317. The lens 127 and the lens retainer are cooled to a temperature below the chamber temperature. In one example, the lens 127 may be cooled to approximately 120 degrees Celsius using a thermoelectric devices 420 within the collar assembly. Alternatively, the lens 127 may be air cooled using a gas within the lens housing tube 351 (or some combination of the two may be used).

A heated, non supercritical gas is generated and introduced into the chamber 301. In one example, steam is generated and introduced at a temperature of 140 degrees Celsius and a pressure of 0.20 MPa into the outer chamber 317. Pressure within the chamber 301 may be bled off as steam is introduced until a humidity sensor detects the appropriate vapor content. Pressure, humidity, and temperature of the environment are maintained at 140 degrees Celsius and 0.20 MPa through a combination of the heating elements 330, the steam inlet valve 327, and the variable position of the pistons 335. All environmental factors are maintained and monitored throughout the process by the control unit 160 to take into account any changes affected by the process. A thin film of liquid (e.g., water) condenses on the lens surface (due to the temperature of the lens). Based on gravitation and normal tension models, the film droops slightly at the center with characteristics of a three dimensional hyperbolic function.

The wafer is cooled to form a layer of liquid, for example, using the thermo-electric devices 610 built into the translatable wafer table 355. In one implementation, the wafer may be cooled using one or more zones corresponding to groups of thermo electric devices 610 of the wafer table 355. A zone may correspond to a small area on the wafer or the entire wafer or multiple zones (contiguous or non contiguous) as instructed by the control unit 160. The zone may be cooled to a temperature necessary to cause a liquid layer to form in the zone. In one example, this may be a drop in temperature of approximately 40 degrees Celsius. The pressure may be increased slightly or the target temperature may be decreased slightly to aid in the formation of the liquid layer that condenses from the heated gas in the chamber. As the zones are cooled, a layer of liquid (e.g., pure water) is formed on a micro-particle scale on the substrate and photo resist. The adhesion of the molecules to the wafer surface and the molecular cohesion of the liquid molecules to themselves allow the formation of the layer of liquid on irregular surfaces without air pockets. The surface tension of the liquid molecules provide smooth layer to develop that has the desired optically properties.

The temperature sensor determines the temperature of the water layer zone. Depending on the thickness of the liquid layer, the temperature gradient of the layer may be determined. The thickness of the layer may be determined using techniques developed for laser determinations of depth as described above. For example, the refractive index of steam at 140 degrees Celsius and 0.2 MPa with the water vapor at saturation is approximately 1.0001 (which is not significantly different from air). The refractive index of water at 100 degrees Celsius is approximately 1.395. Experimental observation may be used to adjust this value.

Once the appropriate temperature and layer thickness have been achieved the control unit 160 actuates a motor control for the lens housing 340 along an axis perpendicular or orthogonal to the plane of the wafer which descends until contact is made with the liquid layer on the wafer. The shape of the liquid layer on the lens 127 facilitates contact at the center of the liquid layer formed within the cooled wafer zone. By making contact at the center and moving outward, the contacting layers reduce the chance of forming air pockets within the liquid intermediary layer. The resultant combined layer of the lens and the substrate forms the intermediary layer between the lens 127 and the wafer. The photo-resist are irradiated with a light from the lithographic device 125 (e.g., UV light) as directed by the control unit 160 and the lithography process. Once completed, the control unit 160 activates the motor and the lens housing 340 move away from the wafer. The zone is heated by the thermo-electric devices 610 and environmental temperatures causing the intermediary liquid layer to evaporate. The process may then be repeated until all desired zones have been exposed or irradiated.

Once the exposure process is complete, the pressure is reduced and the steam is vented from the chamber 301. The process may then be repeated with other wafers.

The process also may be used with Extreme Ultra-Violet systems. According to data published by G. Rathenau in the 1933 publication "Physik" and republished in "Properties of Ordinary Water-Substance" by N. Ernest Dorsey in 1940, there exists a spectral band between 137 nm and 178 nm that has extremely low spectral absorption even at great pressure. Lower spectral absorption provides less energy lost as heat during the EUV exposure process.

Of course various modifications may be made to the system and processes described above without departing from the teachings herein. For example, although the process described above uses a high steam pressure (2 Atmospheres) and temperature (~140 C), a lower relative pressure and temperature also may be used as long as the process remains in the liquid vaporization curve. The same system may be used with little or no modification, although slightly different pressure seal may be used and the pressure may be decreased to lower the temperature vapor point of the liquid.

Some advantages to using a lower pressure and temperature are that conventional fabrication processes use low pressure systems. These are extremely low pressure. The lower pressure and therefore the lower temperature evaporation point allows common photo-resists to be used that may not perform adequately at the higher temperatures outlined. Additionally, a cooler vapor may address some of the fabrication safety issues associated with super heated vapor.

In addition, the process is not limited to technologies employing 193 nm wavelengths and silica based crystals. The process may be applied to lower wavelengths with appropriate changes to the metal oxides used as surfacing material. This due to the above noted regions of transparency between 137 nm and 178 nm.

Other modifications also may be made, for example, the lens 127 and/or wafer table 355 may be first placed in a desired position and the gas may be condensed to for liquid layers on the lens 127 and/or wafer to a desired thickness.

The above disclosure outlines a process for immersion lithography whereby current physical and chemical problems with processes currently being developed are significantly reduced. For example, the process described herein reduces and/or eliminates the formation of air bubbles on the surface of the wafer or in the intermediary layer. In addition, chemical contaminants that can be introduced by the water supply either through the source or due to re-circulation over the wafer material and ablation of the photo resist surface due to the forced injection of the water onto the surface are also minimized and/or are eliminated. Using a higher temperature photo-resist, the higher temperature all steam process outlined above may be utilized to significant cost advantage in terms of processing steps and time. Because steam is used as the introductory medium, the water may be distilled as part of the process providing a significant reduction of any chemical contamination within the water supply.

A number of exemplary implementations have been described. Nevertheless, it will be understood that various modifications may be made. For example, suitable results may be achieved if the steps of described techniques are performed in a different order and/or if components in a described system, architecture, device, or circuit are combined in a different manner and/or replaced or supplemented by other components. Accordingly, other implementations are within the scope of the following claims.

What is claimed is:

1. A method of introducing an intermediary layer of liquid between a lens and a wafer for an immersion lithography process, the method comprising:
   providing a non-supercritical gas;
   condensing the gas to form the intermediary layer of liquid between the lens and the wafer; and
   irradiating the wafer through the lens and the intermediary layer.

2. The method of claim 1 further comprising evaporating the entire intermediary layer.

3. The method of claim 1 wherein providing a non-supercritical gas includes providing superheated steam.

4. The method of claim 3 wherein condensing the gas includes condensing the steam to form the intermediary layer as a layer of water between the lens and the wafer.

5. The method of claim 1 wherein the condensing includes condensing the gas as a layer of liquid on the lens and as a layer of liquid on the wafer.

6. The method of claim 5 further comprising continuing to condense the gas on the lens and the wafer until the layer of liquid on the lens and the layer of liquid on the wafer contact each other to form the intermediary layer.

7. The method of claim 5 further comprising moving the lens and its liquid layer into contact with the liquid layer of the wafer to form the intermediary layer of liquid between the lens and wafer.

8. The method of claim 5 further comprising moving the wafer and its liquid layer into contact with the liquid layer of the lens to form the intermediary layer of liquid between the lens and wafer.

9. The method of claim 5 further comprising moving the lens and its liquid layer and the wafer and its liquid layer into contact to form the intermediary layer of liquid between the lens and wafer.

10. The method of claim 1 wherein condensing the gas includes cooling at least a portion of the wafer to condense the gas as a layer of liquid on the wafer.

11. The method of claim 1 wherein condensing the gas includes cooling the lens to condense the gas as a layer of liquid on the lens.

12. The method of claim 1 wherein irradiating the wafer includes irradiating the wafer with one of a EUV light and UV light.

13. The method of claim 1 wherein condensing gas includes condensing the gas to form a liquid layer in two or more zones on the wafer.

14. The method of claim 13 wherein condensing the gas to form the liquid layer in two or more zones on the wafer includes cooling two or more zones of a wafer table corresponding to the two or more zones on the wafer.

15. The method of claim 1 wherein condensing the gas includes condensing the gas to form a liquid layer on a photo resist of the wafer.

16. The method of claim 1 further comprising providing the wafer including a surface having a first area having hydrophobic surface characteristics to provide enhanced contact angles between the condensed intermediary liquid layer and the wafer surface bordering a second area on the surface having hydrophilic surface characteristics to promote formation of the intermediary layer on the second area of the surface.

17. A system for introduction of an intermediary liquid layer between a lens and a wafer for an immersion lithography process, the system comprising:
   a chamber;
   a source to irradiate the wafer with electromagnetic waves;
   a lens assembly including the lens adapted to allow the electromagnetic waves to pass through the lens to the wafer;
   a non-supercritical gas source; and
   a device to hold the wafer including at least one thermoelectric device to cool at least a portion of the wafer to condense the gas and form the intermediary liquid layer on the wafer.

18. The system of claim 17 wherein the source is one of a UV and a EUV source.

19. The system of claim 18 wherein the holding device moves the wafer in a plane orthogonal to an axis of the lens assembly to position the wafer and the lens assembly moves along the axis.

20. The system of claim 17 wherein the holding device includes a plurality of the thermoelectric devices arranged to cool multiple zones on the wafer to condense the gas as a liquid layer in the zones.

21. The system of claim 17 wherein the lens assembly further comprises a cooling device to cool the lens to condense the gas to form a liquid layer on the lens.

22. The system of claim 17 wherein the wafer includes a surface having a first area on the surface having hydrophobic characteristics to provide enhanced contact angles between the condensed liquid layer and the wafer surface bordering a second area on the surface having hydrophilic characteristics to promote formation of the intermediary layer on the second area of the surface.

23. A wafer for use in an immersion lithography process to facilitate formation of a liquid intermediary layer thereon, the wafer comprising:

a first surface and a second surface, the first surface including a first area on the first surface, the first area having hydrophilic characteristics to promote formation of the liquid intermediary layer from a condensed gas on the first area of the first surface; and a second area on the first surface, bordering the first area of the first surface having hydrophobic characteristics to provide enhanced contact angles between the first surface and the liquid intermediary layer condensed on the first surface.

24. A method of introducing a liquid layer on a wafer for an immersion lithography process, the method comprising:

providing a non-supercritical gas;

condensing the gas to begin forming a liquid layer on the wafer;

continuing to condense the gas to grow the liquid layer until an intermediary layer of liquid is formed;

positioning the intermediary layer between the lens and the wafer; and irradiating the wafer through the lens and the intermediary layer.

* * * * *